United States Patent
Lu et al.

(10) Patent No.: US 11,381,225 B1
(45) Date of Patent: Jul. 5, 2022

(54) SINGLE ENDED RECEIVER

(71) Applicant: NANYA TECHNOLOGY CORPORATION, New Taipei (TW)

(72) Inventors: Cong-An Lu, Taoyuan (TW); Shih-Cheng Hung, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/324,113

(22) Filed: May 19, 2021

(51) Int. Cl.
*H03K 3/017* (2006.01)
*H04L 25/02* (2006.01)
*G05F 3/26* (2006.01)
*H03K 19/0175* (2006.01)

(52) U.S. Cl.
CPC .............. *H03K 3/017* (2013.01); *G05F 3/26* (2013.01); *H03K 19/017509* (2013.01); *H03K 19/017545* (2013.01); *H04L 25/0294* (2013.01)

(58) Field of Classification Search
None
See application file for complete search history.

(56) References Cited

U.S. PATENT DOCUMENTS

2006/0232312 A1* 10/2006 Baker ................. H03K 5/1565
327/175

* cited by examiner

*Primary Examiner* — Jany Richardson
(74) *Attorney, Agent, or Firm* — CKC & Partners Co., LLC

(57) ABSTRACT

A single ended receiver includes a current mode logic circuit, a differential to single amplifier, and a voltage detector. The current mode logic circuit is configured to receive an input signal and a reference voltage value and is configured to output a first output signal. The differential to single amplifier is coupled to the current mode logic circuit and is configured to receive the first output signal and to output a second output signal. The voltage detector is coupled to the differential to single amplifier and is configured to output a control signal to the differential to single amplifier according to the reference voltage value. The differential to single amplifier is further configured to adjust a voltage value of the differential to single amplifier internal signal according to the control signal, so that a duty cycle of the second output signal is adjusted.

9 Claims, 3 Drawing Sheets

SINGLE ENDED RECEIVER

BACKGROUND

Technical Field

The present disclosure relates to a single ended receiver. More particularly, the present disclosure relates to a single ended receiver for improving the duty cycle with different input bias level.

Description of Related Art

The reference voltage value is adjustable by different application. In a single ended receiver, the duty cycle of the input signal is easily influenced by the reference voltage value when transmitting from the current mode logic circuit to the differential to single amplifier. Therefore, how to maintain the voltage value of the input cycle so that the duty cycle of the output signal is not distorted is a problem that needs to be solved.

SUMMARY

A single ended receiver includes a current mode logic circuit, a differential to single amplifier, and a voltage detector. The current mode logic circuit is configured to receive an input signal and a reference voltage value and is configured to output a first output signal. The differential to single amplifier is coupled to the current mode logic circuit and is configured to receive the first output signal and to output a second output signal. A differential to single amplifier internal signal is generated according to the first output signal, and the second output signal is generated according to the differential to single amplifier internal signal. The voltage detector is coupled to the differential to single amplifier and is configured to output a control signal to the differential to single amplifier according to the reference voltage value. The differential to single amplifier is further configured to adjust a voltage value of the differential to single amplifier internal signal according to the control signal, so that a duty cycle of the second output signal is adjusted.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
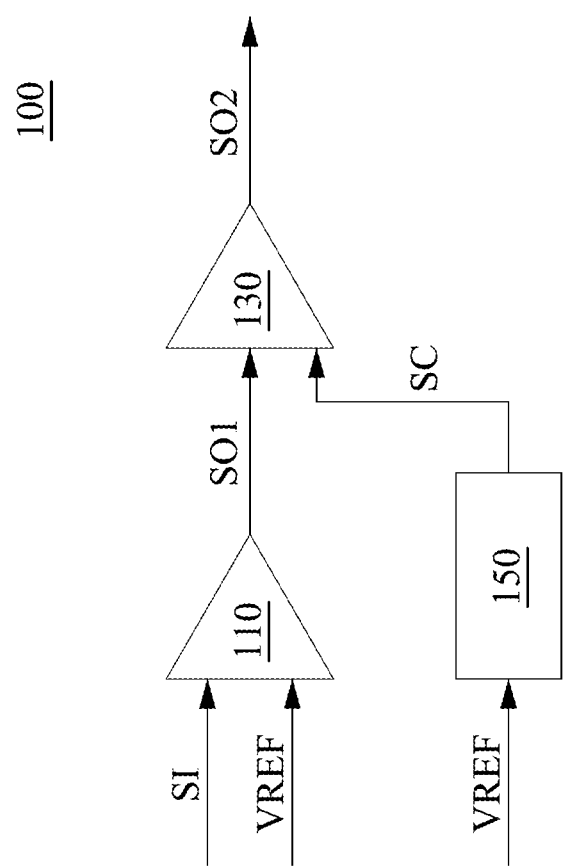
FIG. 1 is a schematic diagram illustrating a single ended receiver according to some embodiments of the present disclosure.

Reference is made to FIG. 1. FIG. 1 is a schematic diagram illustrating a single ended receiver 100 according to some embodiments of the present disclosure. The single ended receiver 100 includes a current mode logic circuit 110, a differential to single amplifier 130 and a voltage detector 150. In the connection relationship, the current mode logic circuit 110 is coupled to the differential to single amplifier 130, and the differential to single amplifier 130 is coupled to the voltage detector 150. The single ended receiver as illustrated in FIG. 1 is for illustrative purposes only, and the embodiments of the present disclosure are not limited thereto.

In the operational relationship, the current mode logic circuit 110 receives the input signal SI and the reference voltage value VREF, and output the output signal SO1 according to the input signal SI and the reference voltage value VREF. The voltage detector 150 receives the reference voltage value VREF and outputs the control signal SC according to the reference voltage value VREF. The signal amplifier 130 receives the output signal SO1 and the control signal SC and outputs the output signal SO2 according to the output signal SO1 and the control signal SC.

Figure 2:
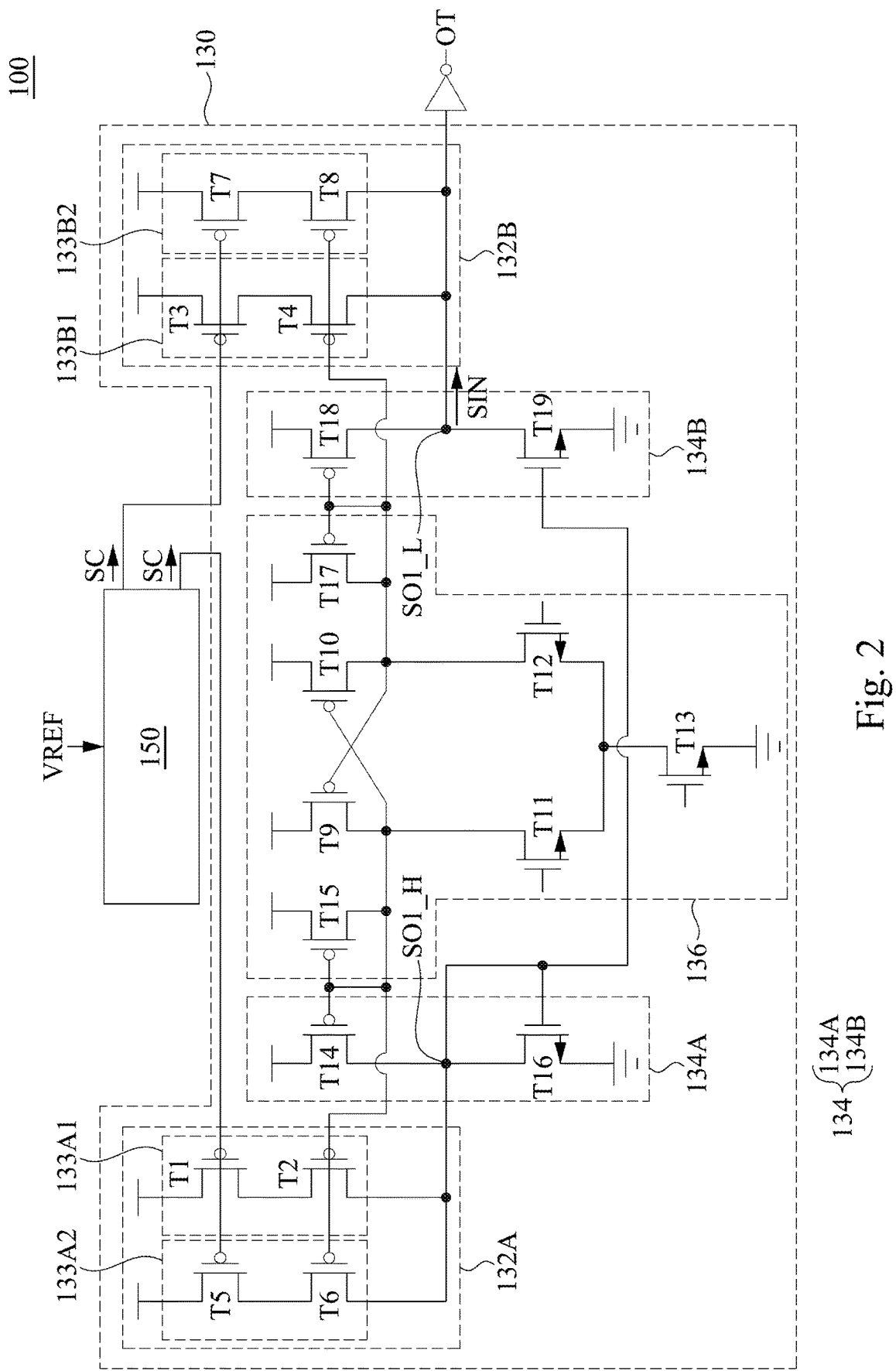
FIG. 2 is a schematic diagram illustrating part of a single ended receiver according to some embodiments of the present disclosure.

Reference is made to FIG. 2. FIG. 2 is a schematic diagram illustrating part of a single ended receiver 100 according to some embodiments of the present disclosure.

The differential to single amplifier 130 is further configured to adjust a voltage value of the differential to single amplifier internal signal SIN according to the control signal SC, so that a duty cycle of the output signal SO2 is adjusted to be close to the input signal SI. The differential to single amplifier internal signal SIN is generated according to the output signal SO1, and the output signal SO2 is generated according to the differential to single amplifier internal signal SIN.

In some embodiment, when the reference voltage value VREF is higher than a standard reference voltage value, the differential to single amplifier 130 is configured to decrease the voltage value of the differential to single amplifier internal signal SIN through the node SO1_H. On the other hand, when the reference voltage value VREF is lower than the standard reference voltage value, the differential to single amplifier 130 is configured to increase the differential to single amplifier internal signal SIN through the node SO1_L.

As illustrated in FIG. 2, the differential to single amplifier 130 includes a differential pair circuit 136, a control circuit 132A, a control circuit 132B, and a current mirror circuit 134. The current mirror circuit 134 includes a sub current mirror circuit 134A and a sub current mirror circuit 134B. In the connection relationship, the control circuit 132A is connected to the current mirror circuit 134A, the control circuit 132B is connected to the sub current mirror circuit 134B, and the sub current mirror circuit 134A and the sub current mirror circuit 134B are connected to the differential pair circuit 136. The control circuit 132B is coupled to the output end OT.

The differential pair circuit 136 includes the transistors T9, T10, T11, T12, and T13, T15, and T17. The sub current mirror circuit 134A includes the transistors T14 and T16. The sub current mirror circuit 134B includes the transistors T18 and T19. The control circuit 132A includes the transistors T1, T2, T5, and T6. The control circuit 132B includes the transistors T3, T4, T7, and T8.

In the operational relationship, the differential pair circuit 136 is configured to receive the output signal SO1. In some embodiments, the differential pair circuit 136 receives the output signal SO1 from the control end of the transistor T11 and T12.

When the reference voltage value VREF is lower than the standard reference voltage value, the control circuit 132A is not conducted and the control circuit 132B is conducted, so that the voltage value of the differential to single amplifier internal signal SIN is increased through the node SO1_L. In detail, since the voltage value of the node SO1_L is increased when the control circuit 132B is conducted, the voltage value of the differential to single amplifier internal signal SIN is increased accordingly.

On the other hand, when the reference voltage value VREF is higher than the standard reference voltage value, the control circuit 132A is conducted and the control circuit 132B is not conducted, so that the voltage value of the differential to single amplifier internal signal SIN is decreased through the node SO1_H. In detail, since the voltage value of the node SO1_H is increased when the control circuit 132A is conducted, the voltage value of the differential to single amplifier internal signal SIN is decreased accordingly.

In some embodiments, the control circuit 132A includes the sub control circuit 133A1, and the control circuit 132B includes the sub control circuit 133B1. The sub control circuit 133A1 includes a transistor T1 and a transistor T2. The transistor T1 and the transistor T2 are connected in series with each other. The sub control circuit 133B1 includes a transistor T3 and a transistor T4. The transistor T3 and the transistor T4 are connected in series with each other.

When the reference voltage value VREF is higher than the standard reference voltage value, the transistor T1 is conducted and the transistor T2 is configured to pull up the voltage value of the node SO1_H. The transistor T3 and the transistor T4 are not conducted.

On the other hand, when the reference voltage value VREF is lower than the standard reference voltage value, the transistor T3 is conducted and the transistor T4 is configured to pull up the voltage value of the node SO1_L. The transistor T1 and the transistor T1 are not conducted.

In some embodiments, the control end of the transistor T1 and the control end of the transistor T3 are configured to receive the control signal SC so as to be conducted or not conducted.

In some embodiments, the control circuit 132A further includes a sub control circuit 133A2, and the control circuit 132B further includes a sub control circuit 133B2. The sub control circuit 133A1 and the sub control circuit 133A2 are connected in parallel with each other. The sub control circuit 133B1 and the sub control circuit 133B2 are connected in parallel with each other.

The sub control circuit 133A2 includes a transistor T5 and a transistor T6. The sub control circuit 133B2 includes a transistor T7 and a transistor T8.

In some embodiments, the voltage detector 150 is further configured to output the control signal SC according to a voltage difference value between the reference voltage value VREF and the standard reference voltage value.

In some embodiments, when the voltage difference value increases, the number of the conducted sub control circuit increases.

In some embodiments, the voltage detector 150 further includes a table. In some embodiments, when the voltage difference value is lower than a first threshold voltage difference value and the reference voltage value VREF is higher than the reference voltage value, the sub control circuit 133A1 is conducted, and the sub control circuit 133A2, the sub control circuit 133B1, and the sub control circuit 133B2 are not conducted.

When the voltage difference value is not lower than a first threshold voltage difference value and is lower than a second threshold voltage difference value and the reference voltage value VREF is higher than the reference voltage value, the sub control circuit 133A1 and the sub control circuit 133A2 are conducted, and the sub control circuit 133B1 and the sub control circuit 133B2 are not conducted.

In some embodiments, when the voltage difference value is lower than a first threshold voltage difference value and the reference voltage value VREF is lower than the reference voltage value, the sub control circuit 133B1 is conducted, and the sub control circuit 133B2, the sub control circuit 133A1, and the sub control circuit 133A2 are not conducted.

When the voltage difference value is not lower than a first threshold voltage difference value and is lower than a second threshold voltage difference value and the reference voltage value VREF is lower than the reference voltage value, the sub control circuit 133B1 and the sub control circuit 133B2 are conducted, and the sub control circuit 133A1 and the sub control circuit 133A2 are not conducted.

The more the sub control circuits are conducted, the more the voltage value of the node SO1_H or SO1_L is increased.

The number of the conducted sub control circuits is controlled by the control signal SC.

Figure 3:
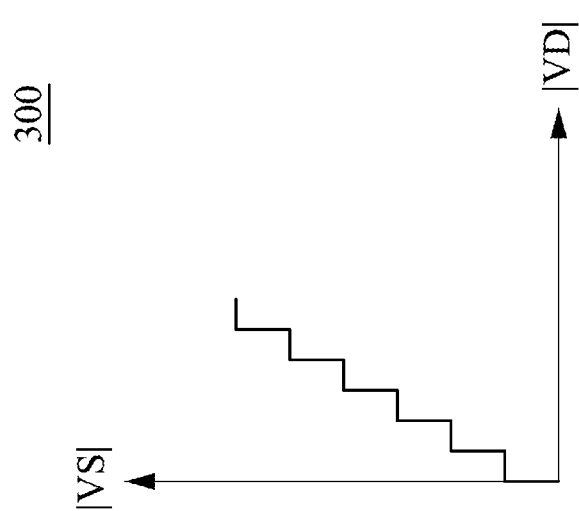
FIG. 3 is a schematic diagram illustrating a relationship between the voltage difference value and the adjusted voltage difference value of the output signal.

Reference is made to FIG. 3. FIG. 3 is a schematic diagram illustrating a relationship between the voltage difference value and the adjusted voltage difference value of the node SO1_H or SO1_L. VD is the voltage difference value between the reference voltage value VREF and the standard reference voltage value. VS is the adjusted voltage difference value of the node SO1_H or SO1_L. As illustrated in FIG. 3, the voltage difference value VD and the adjusted voltage difference value VS is in a proportional relationship.

Figure 4:
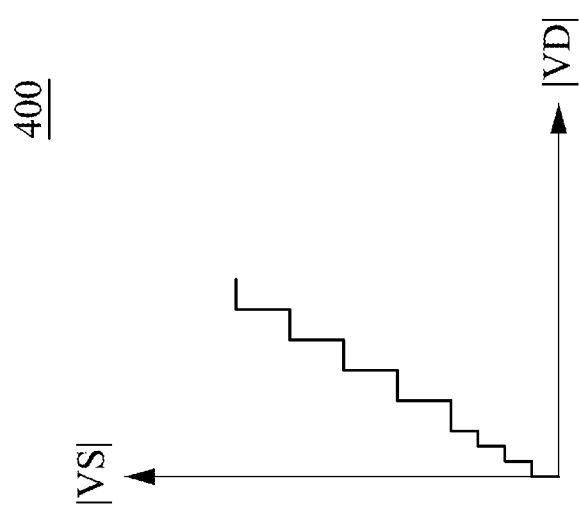
FIG. 4 is another schematic diagram illustrating a relationship between the voltage difference value and the adjusted voltage difference value of the output signal.

Reference is made to FIG. 4. FIG. 4 is another schematic diagram illustrating a relationship between the voltage difference value and the adjusted voltage difference value of the node SO1_H or SO1_L. As illustrated in FIG. 4, the larger the voltage difference value VD, the larger the adjusted voltage difference value VS.

In some embodiments, the single ended receiver 100 is the receiver located at the I/O terminal of the DRAM memory.

It should be noted that, the p-type and n-type transistors in the embodiments of the present disclosure is for illustrative purposes only, other transistors may be included within the scope of the present disclosure.

According to the embodiment of the present disclosure, it is understood that the embodiments of the present disclosure are to provide a single ended receiver, so as to adjust the voltage value of the node SO1_H or SO1_L and the voltage value of the differential to single amplifier internal signal SIN is increased or decreased accordingly, so that the duty cycle of the output signal SO2 is the same or close to the duty cycle of the input signal SI.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A single ended receiver, comprising:
a current mode logic circuit, configured to receive an input signal and a reference voltage value, and to output a first output signal; and
a differential to single amplifier, coupled to the current mode logic circuit, and configured to receive the first output signal and to output a second output signal, wherein a differential to single amplifier internal signal is generated according to the first output signal, and the second output signal is generated according to the differential to single amplifier internal signal; and
a voltage detector, coupled to the differential to single amplifier, and configured to output a control signal to the differential to single amplifier according to the reference voltage value,
wherein the differential to single amplifier is further configured to adjust a voltage value of the differential to single amplifier internal signal according to the control signal, so that a duty cycle of the second output signal is adjusted;
wherein the voltage detector is further configured to output the control signal according to a voltage difference value between the reference voltage value and a standard reference voltage value.

2. The single ended receiver of claim 1, wherein when the reference voltage value is higher than the standard reference voltage value, the differential to single amplifier is configured to decrease the voltage value of the differential to single amplifier internal signal through a first node, and when the reference voltage value is lower than the standard reference voltage value, the differential to single amplifier is configured to increase the voltage value of the differential to single amplifier internal signal through a second node.

3. The single ended receiver of claim 1, wherein the differential to single amplifier comprises:
a differential pair circuit, configured to receive the first output signal;
a first control circuit;
a second control circuit, coupled to an output end;
a differential pair circuit; and
a current mirror circuit, comprising:
a first sub current mirror circuit, coupled to the first control circuit and the differential pair circuit through a first node; and
a second sub current mirror circuit, coupled to the second control circuit and the differential pair circuit through a second node.

4. The single ended receiver of claim 3, wherein when the reference voltage value is higher than the standard reference voltage value, the first control circuit is conducted and the second control circuit is not conducted so as to decrease the voltage value of the differential to single amplifier internal signal through the first node, and when the reference voltage value is lower than the standard reference voltage value, the first control circuit is not conducted and the second control circuit is conducted so as to increase the voltage value of the differential to single amplifier internal signal through the second node.

5. The single ended receiver of claim 3, wherein the first control circuit comprises:
a first sub control circuit, wherein the first sub control circuit comprises:
a first transistor and a second transistor connected in series with each other, wherein when the reference voltage value is higher than the standard reference voltage value, the first transistor is conducted and the second transistor is configured to pull down the voltage value of the differential to single amplifier internal signal through the first node.

6. The single ended receiver of claim 3, wherein the second control circuit comprises:
a second sub control circuit, wherein the second sub control circuit comprises:
a first transistor and a second transistor connected in series with each other, wherein when the reference voltage value is lower than the standard reference voltage value, the first transistor is conducted and the second transistor is configured to pull up the voltage value of the differential to single amplifier internal signal through the second node.

7. The single ended receiver of claim 6, wherein a control end of the first transistor is configured to receive the control signal.

8. The single ended receiver of claim 3, wherein the first control circuit comprises a plurality of first sub control circuits connected in parallel with each other, wherein when the reference voltage value is lower than the standard reference voltage value, a number of the plurality of first sub control circuits is conducted, wherein when the voltage difference value between the reference voltage value and the standard reference voltage value increases, the number increases.

9. The single ended receiver of claim 8, wherein the voltage detector further comprises a table, and the number is determined according to the table.

* * * * *